(12) United States Patent
Shi et al.

(10) Patent No.: US 11,282,735 B2
(45) Date of Patent: Mar. 22, 2022

(54) ELECTROSTATIC CHUCK AND SEMICONDUCTOR EQUIPMENT

(71) Applicant: BEIJING NAURA MICROELECTRONICS EQUIPMENT CO., LTD., Beijing (CN)

(72) Inventors: Quanyu Shi, Beijing (CN); Shuaitao Shi, Beijing (CN); Mengxin Zhao, Beijing (CN); Jinrong Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 84 days.

(21) Appl. No.: 16/765,605

(22) PCT Filed: Nov. 15, 2018

(86) PCT No.: PCT/CN2018/115667
§ 371 (c)(1),
(2) Date: May 20, 2020

(87) PCT Pub. No.: WO2019/105236
PCT Pub. Date: Jun. 6, 2019

(65) Prior Publication Data
US 2020/0312692 A1 Oct. 1, 2020

(30) Foreign Application Priority Data
Nov. 28, 2017 (CN) .................. 201711223776.X

(51) Int. Cl.
*H01L 21/683* (2006.01)
*H01L 21/687* (2006.01)

(52) U.S. Cl.
CPC .... *H01L 21/6833* (2013.01); *H01L 21/68735* (2013.01)

(58) Field of Classification Search
CPC ........... H01L 21/6833; H01L 21/68735; H01L 21/67109; H01L 21/67248; H01L 21/6831; H01L 21/68785
See application file for complete search history.

(56) References Cited

U.S. PATENT DOCUMENTS

2003/0003749 A1* 1/2003 Sexton ................ H01L 21/6833
438/694
2003/0168439 A1* 9/2003 Kanno .............. H01L 21/67109
219/390

(Continued)

FOREIGN PATENT DOCUMENTS

CN 1941317 A 4/2007
CN 107808848 A 3/2018

(Continued)

OTHER PUBLICATIONS

World Intellectual Property Organization (WIPO) International Search Report for PCT/CN2018/115667 dated Feb. 3, 2019 5 Pages.

*Primary Examiner* — Thienvu V Tran
*Assistant Examiner* — Bart Iliya
(74) *Attorney, Agent, or Firm* — Anova Law Group, PLLC

(57) ABSTRACT

An electrostatic chuck includes a support assembly including a base, a chuck placed at the base and configured to carry a workpiece, and a fastening assembly configured to removably fix the chuck at the base.

20 Claims, 6 Drawing Sheets

(56) References Cited

U.S. PATENT DOCUMENTS

| | | | |
|---|---|---|---|
| 2012/0061351 A1* | 3/2012 | Ohata | H01J 37/32091 216/67 |
| 2013/0001899 A1 | 1/2013 | Hwang et al. | |
| 2019/0066982 A1* | 2/2019 | Sato | H01L 21/6833 |

FOREIGN PATENT DOCUMENTS

| | | |
|---|---|---|
| JP | 2000277597 A | 10/2000 |
| JP | 2000277598 A | 10/2000 |
| TW | I373092 B | 9/2012 |

\* cited by examiner

ELECTROSTATIC CHUCK AND SEMICONDUCTOR EQUIPMENT

CROSS-REFERENCES TO RELATED APPLICATIONS

This application is a national phase entry under 35 U.S.C. § 371 of International Application No. PCT/CN2018/115667, filed on Nov. 15, 2018, which claims priority of Chinese patent application No. 201711223776.X, filed with the State Intellectual Property Office of P. R. China on Nov. 28, 2017, the entire contents of both of which are incorporated herein by reference in their entirety.

TECHNICAL FIELD

The present disclosure relates to the semiconductor manufacturing technology field and, more particularly, to an electrostatic chuck and a semiconductor equipment.

BACKGROUND

Semiconductor equipment is widely used in manufacturing processes of semiconductors, solar cells, flat panel displays, etc. The current semiconductor equipment generally uses an electrostatic chuck (ESC) to hold a to-be-processed workpiece during a process. The ESC is widely used in manufacturing equipment of integrated circuits (IC).

After being in use for a long time, the ESC would wear out to various degrees and some components would be damaged. The ESC thus needs to be replaced and maintained regularly. The conventional ESC uses a welded integrated structure, which means the internal component of the ESC cannot be maintained. The ceramic part of the ESC cannot be easily replaced and repaired. The ESC needs to be disassembled as a whole to be repaired and refurbished.

FIG. 1 is a current removable ESC, which includes an ESC ceramic part 100, an ESC auxiliary part 110, and connection screws 120 for connecting these two parts. The ESC ceramic part 100 includes a chuck functional part 101, a base support 103, and an intermediate welded material part 102 that welds both parts together. The chuck functional part 101 is made of aluminium nitride (AlN) ceramic, and the base support 103 is made of aluminium silicon carbide (AlSiC) ceramic. Due to limitations of manufacturing capabilities, the chuck functional part 101 cannot be made very thick (more than 24 mm), and especially its edge is thin and cannot withstand vertical shear stress. As such, a thick base support 103 needs to be welded to the chuck functional part to increase its strength and to withstand shear forces.

As shown in FIG. 1 and FIG. 2, the ESC auxiliary part 110 includes a welded bellows base 111, a graphite thermal conductive film 112, a water-cooled disk upper plate 113, a water-cooled disk lower plate 114, a tension spring 115, an electrode wiring 116, a water pipeline 117, a large seal ring 118, a small seal ring 119, and a thermocouple 1101. Among these, the base support 103 uses a customized seal ring with a large fitting area (a width generally exceeds 5 mm) for vacuum sealing. The thermocouple 1101 passes through a hole of the base support 103 to measure the temperature of the chuck functional part 101. The supporting surface of the large seal ring 118 is a sealing groove at the top of the welded bellows base 111. The supporting surface of the small seal ring 119 is the water-cooled disk upper plate 113. The water-cooled disk upper plate 113 and the water-cooled disk lower plate 114 are welded by diffusion welding. The tension spring 115 applies an upward pressing force to the water-cooled disk lower plate 114, such that the water-cooled disk upper plate 113, the graphite thermal conductive film 112, and the base support 103 fit seamlessly to each other. The electrode wiring 116 and the water pipeline 117 vertically pass through the holes close to centers of the water-cooled disk upper plate 113 and the water-cooled disk lower plate 114.

During implementations of the present disclosure, the inventors discovered following deficiencies of the prior art.

Firstly, the ESC ceramic part 100 is manufactured by welding the chuck functional part 101 and the base support 103. The welding process is complicated and difficult, with a high a scrap rate. The cost of a finished product is high. At the same time, since the ESC ceramic part 100 has complex electrical characteristic and includes two kinds of welding materials such as ceramic and metal materials, it is difficult to weld uniformly. Such a design is not suitable for an electrical environment with a radio frequency signals in a physical vapor deposition (PVD) chamber.

Secondly, the base support 103 uses the AlSiC ceramic material, the ceramic material has a resistance of only E-5 $\Omega \cdot cm$, which is a conductor. The base support 103 is welded integrally with the chuck functional part 101, which means it cannot be easily replaced. This impairs the electrical performance of other parts in contact with the chuck functional part 101.

SUMMARY

The purpose of the present disclosure is to solve at least partially the technical problem in the prior art and provide an electrostatic chuck (ESC) and related semiconductor equipment.

One aspect of the present disclosure provides an ESC, which includes a support assembly including a base, a chuck configured at the base and configured to carry a to-be-processed workpiece, and a fastening assembly configured to removably hold the chuck at the base.

Another aspect of the present disclosure provides semiconductor equipment, which includes a reaction chamber, where the ESC is provided in the reaction chamber and the ESC may be any of the above ESCs.

The ESC provided by the present disclosure has a chuck removably fixed at the base by the fastening assembly. Compared to the welding method used in the prior art, the main body of the chuck can be easily disassembled and replaced. This eliminates the electrical performance limitations of other parts in contact with the ESC. At the same time, since the chuck does not need to be welded with other ceramic materials, it not only can reduce the difficulty level and cost of process, but also can improve stability of the electrical performance and reduce variability because of single material. Accordingly, this is beneficial for designs of the various shape and dimension of the chuck to improve its strength and processability.

BRIEF DESCRIPTION OF THE DRAWINGS

With description of the present disclosure according to following reference drawings, the above-mentioned or other purpose, features, and advantages of the present disclosure are clearer.

REFERENCE NUMERALS

100—electrostatic chuck ceramic part;
101—chuck functional part; 102—intermediate welded material part; 103—base support; 120—connection screw;
110—electrostatic chuck auxiliary part;
111—welded bellows base; 112—graphite thermal conductive film; 113—water-cooled disk upper plate; 114—water-cooled disk lower plate; 115—tension spring; 116—electrode wiring; 117—water pipeline; 118—large seal ring; 119—small seal ring; 1101—thermocouple;
20—electrostatic chuck;
21—fastening assembly; 211—pressure ring; 2111—pressure ring body; 2112—pressing part; 212—screw;
22—chuck; 220—chuck body; 221—protrusion; 2211—first rounded corner; 2212—second rounded corner; 2213—central air hole; 2114—branch air hole; 2215—thimble hole; 222—electrode terminal; 223—potential measurement terminal; 224—edge part; 225—first recess;
23—support assembly;
231—base; 2311—base body; 2312—annular protrusion; 2313—second recess; 2314—pipeline; 232—first seal ring; 233—water-cooled disk; 234—thermocouple; 235—second seal ring; 236—central air tube base; 237—first support; 238—central air tube; 239—bellows.

DETAILED DESCRIPTION

To make purposes, technical solutions, and advantages of the present disclosure clearer, the present disclosure is further described in detail below in conjunction with embodiments and with reference to drawings. It should be noted that, the description is merely illustrative, but does not necessarily limit the scope of the present disclosure. In the following specification, description of a well-known structure and technology are omitted to avoid unnecessarily obscuring concepts of the present disclosure.

Figure 1:
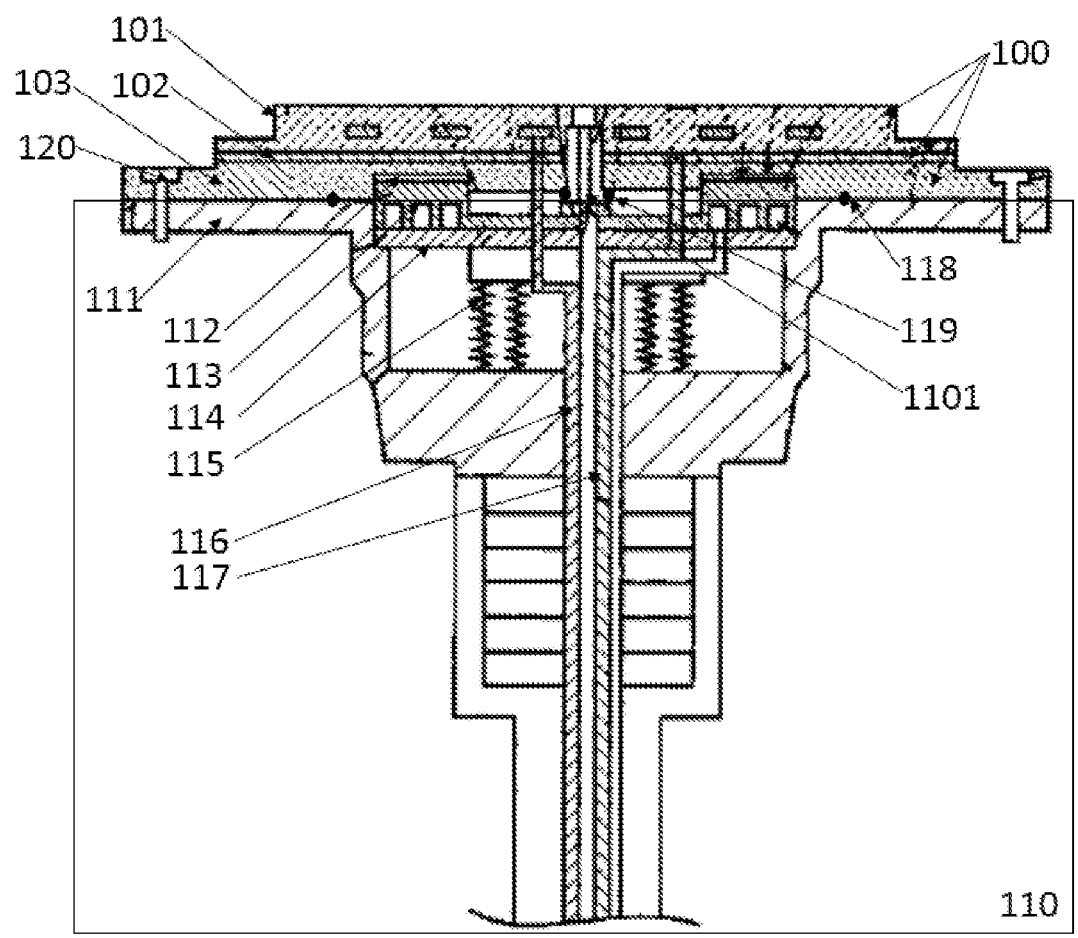
FIG. 1 is a schematic structural diagram of an electrostatic chuck in the prior art.
Figure 2:
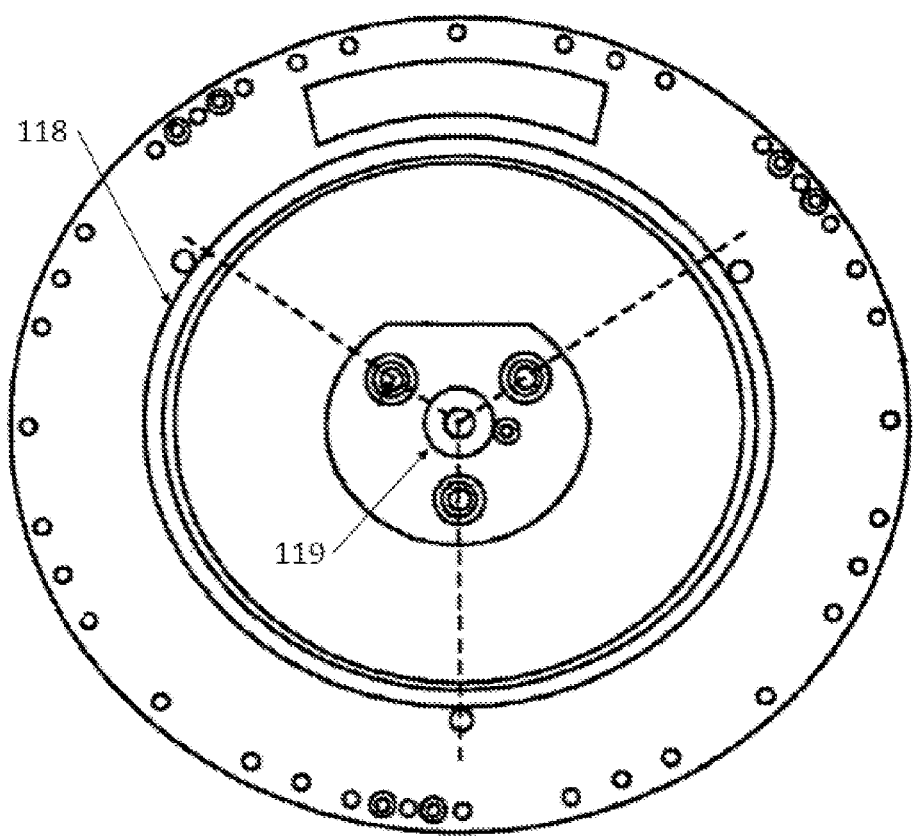
FIG. 2 is a top view of an electrostatic chuck auxiliary part of the electrostatic chuck shown in FIG. 1.
Figure 3:
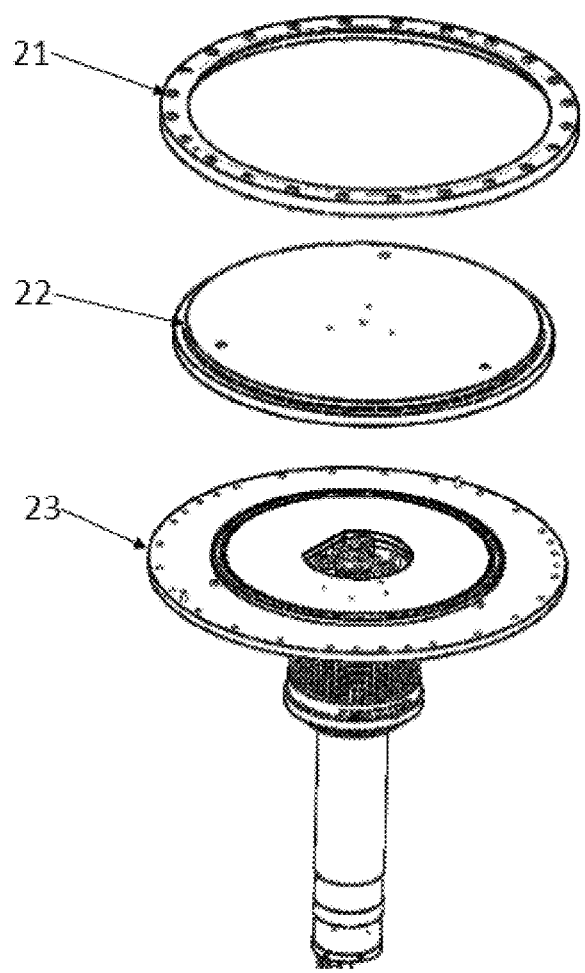
FIG. 3 is an assembly structural diagram of the electrostatic chuck according to embodiments of the present disclosure.
Figure 4:
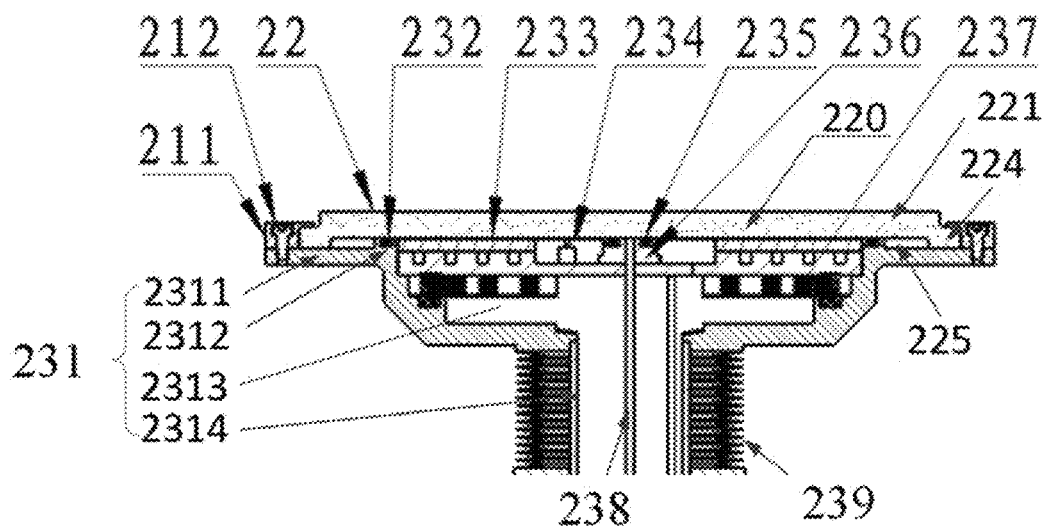
FIG. 4 is a sectional structural diagram of the electrostatic chuck according to embodiments of the present disclosure.

Referring to FIG. 3 and FIG. 4, an electrostatic chuck according to embodiments of the present disclosure includes a chuck 22, a support assembly 23, and a fastening assembly 21. The support assembly 23 includes a base 231. The chuck 22 is placed at the base 231 and is configured to carry a to-be-processed workpiece, and the fastening assembly 21 is configured to fix the chuck 22 removably at the base 231.

In some embodiments, the chuck 22 is manufactured with integrally formed single ceramic material. The ceramic material may be aluminium nitride (AlN), aluminium oxide ($Al_2O_3$), etc.

The chuck 22 is removably fixed by the fastening assembly 21 at the base 231. Compared to a welding method used in the prior art, in embodiments of the present disclosure, it is convenient to disassemble and replace the chuck 22. This eliminates the limitations of electrical performance of the other parts that are in contact with the chuck. At the same time, the chuck 22 does not need to be welded with other ceramic materials. This can reduce the difficulty and cost of the process. Because of the use of a single material, it can also improve the stability of the electrical performance and reduce variability, which is beneficial to design the shape and dimension of the chuck to improve strength and processability.

Figure 5:
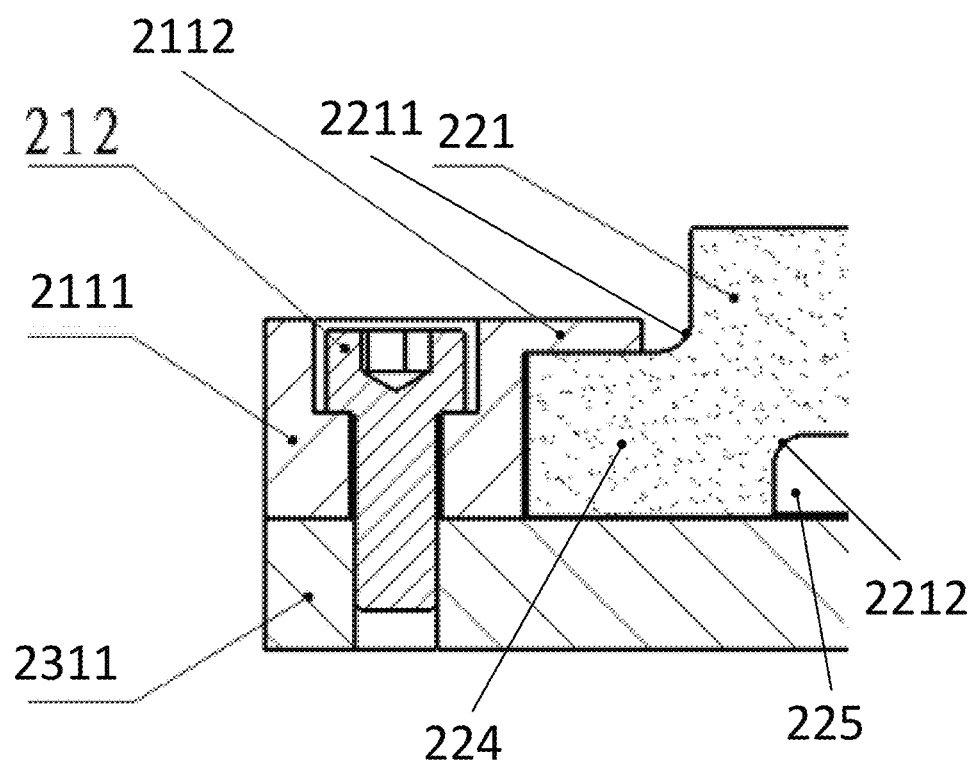
FIG. 5 is a partial sectional diagram of the electrostatic chuck according to embodiments of the present disclosure.

In some embodiments, as shown in FIG. 5, the fastening assembly 21 includes a pressure ring 211, which includes a pressure body 2111 placed at the base 231 and surrounding the chuck 22. The pressure ring body 2111 is fixedly connected to the base 231 by a plurality of screws 212. A pressing part 2112 is placed at the pressure ring body 2111 and presses an edge part 224 of the chuck 22.

Optionally, the pressure ring 211 uses materials including ceramic, metal, etc. By selecting the pressure ring 211 of different materials, the electrical performance of the pressure ring 211 can be easily changed to adapt to reaction chambers with different conductive requirements.

By fixing the chuck 22 with the pressure ring 211 and screws 212, the chuck 22 can be removably fixed at the base 231, such that it can be conveniently disassembled and replaced. It is not necessary to punch holes at the chuck 22, which reduces probability of microcracks during processing, effectively prevents a spread of the microcracks, increases fracture strength of the chuck 22, and makes chuck 22 strong enough to withstand shear forces.

In some embodiments, a plurality of screws 212 are uniformly arranged along a circumferential direction of the pressure ring body 2111, so as to uniformly press the chuck 22.

If there are too few screws 212, local stresses of the chuck body 220 cannot be effectively reduced. This is not beneficial to increase ability to withstand the shear forces. If there are too many screws 212, disassembly labor intensity is increased. Therefore, the number of the screws 212 is preferably 10-50, such that the local stresses of the chuck body 220 can be effectively reduced, and the disassembly labor intensity is not excessive.

In some embodiments, as shown in FIG. 4 and FIG. 5, the chuck 22 includes the chuck body 220. A protrusion 221 is formed at a middle area of a first surface (i.e., upper surface) of the chuck body 220 facing away from the base 231 and is configured to carry the to-be-processed workpiece. The pressing part 2112 is stacked at an edge area of the above-mentioned first surface to press the edge part 224 of the chuck 22.

Optionally, a surface of the pressing part 2112 facing away from a surface of the base 231 is lower than a surface of the protrusion 221 for carrying the to-be-processed workpiece. Accordingly, this can avoid the effect by other parts such as a focus ring placed around the chuck body 220.

In some embodiments, the support assembly further includes portions of functional part of a water-cooled disk 233, a thermocouple 234, a central air tube base 236, etc., and pipelines connected to the functional part. A first recess 225 is formed at a second surface (i.e., bottom surface) of the chuck body 220 facing the base 231. The first recess 225 and the base 231 form a space, which is configured to accommodate the above-mentioned functional part and the pipelines connected to the functional part.

In some embodiments, the edge part 224 surrounds the protrusion 221 of the chuck 22. The thickness of the edge part 224 can be increased to increase the structural strength of the chuck 22, thereby enhancing its ability to withstand the shearing forces. Compared to the prior art, it is not necessary to weld a base support to increase the strength, and the chuck 22 can be directly fixed to the support assembly 23. The increase of the thickness of the edge part 224 leads to increase overall height of the chuck 22 and causes center part of the chuck body 220 to be too thick. This may result in incomplete sintering during processing the chuck 22 and a non-uniform ceramic particle size after fabrication, and affect the strength and mechanical properties of the chuck 22. Therefore, by placing the first recess 225 at the bottom surface of the chuck body 220, the center part thickness of the chuck 22 is reduced. The overall height of the chuck body 220 is increased, but the thickness is not increased. That is, the thickness of the edge part 224 is increased, but the center part thickness besides the edge part 224 is not increased. This reduces issued related to the situation of the incomplete sintering, the non-uniform ceramic particle size, and influence of the strength of the chuck body and the mechanical performance.

It should be noted that, in some embodiments, the pressing part 2112 is placed at the pressure ring body 2111 and presses the edge part 224 of the chuck 22. However, the present disclosure is not limited to this, in actual application, the overall pressure ring is stacked at the edge area of the first surface of the chuck body 220 facing away from the base 231. Based on this, the protrusion 221 is formed at a center area of the first surface of the chuck body 220 facing away from the base 231 and is configured to carry the to-be-processed workpiece. The first recess 225 is formed at the second surface of the chuck body 220 facing the base 231. The first recess 225 and the base 231 form the space to accommodate the functional part and the pipelines connected to the functional part.

In some embodiments, as shown in FIG. 5, a first rounded corner 2211 is formed at an intersection of the edge area of the first surface (i.e., upper surface) of the chuck body 220 facing away from the base 231 and a side surface of the protrusion 221. A second rounded corner 2212 is formed at an intersection of a bottom surface and a side surface of the first recess 225. A cross section passing through the first rounded corner 2211 and the second rounded corner 2212 is a shear surface of the chuck 22. A part between the first rounded corner 2211 and the second rounded corner 2212 is a structurally weak part of the chuck 22, and strength of the structurally weak part is lower than strength of other parts of the chuck 22. In order to ensure that the chuck 22 has the sufficient structural strength to withstand the shearing forces, optionally, the protrusion 221 and the first recess 225 are arranged concentrically, and a diameter of the first recess 225 is smaller than a diameter of the protrusion 221. Accordingly, this causes the side surface of the first recess 225 to be closer to the center of the chuck 22 than the side surface of the protrusion 221, such that the structurally weak part has a larger thickness, and the shear surface has a larger area, which ensures that the chuck 22 has sufficient structural strength. Even if the chuck 22 is directly fixed to the support assembly 23, it has the ability to withstand the shearing forces.

In some embodiments, the base 231 of the support assembly includes a base body 2311 and a first support 237. An annular protrusion 2312 is formed at a third surface (i.e., upper surface) of the base body 2311 facing the chuck body 220. The annular protrusion 2312 contacts the bottom surface of the first recess 225. A first seal ring 232 is placed between the annular protrusion 2312 and the bottom surface of the first recess 225 and is configured to seal a gap between them, so as to implement sealing of the chuck body 220 and the base body 2311. Optionally, since the chuck body 220 of the embodiments is not welded with the base support of AlSiC ceramic material, the first seal ring 232 can be a standard O-ring and does not need to use a customized seal ring to realize the sealing, which reduces cost.

A second recess 2313 is formed at the third surface of the base body 2311 facing the chuck body 220 and at an inside surface of the above-mentioned annular protrusion 2312, and is configured to form the space with the first recess 225 to accommodate the above-mentioned functional part and the pipelines connected to the functional part. Specifically, with the sealing of the first seal ring 232, the area enclosed by the first recess 225, the outer side of the annular protrusion 2312, the second recess 2313, and the large seal ring 232 is in a vacuum state.

The first support 237 is placed at the above-mentioned second recess 2313 and is configured to support the functional part and cause the functional part to contact the bottom surface of the first recess 2313. Optionally, the first support 237 is an elastic piece such as an abutting spring, etc., and is configured to generate an elastic force to cause the functional part to contact the bottom surface of the first recess 225 through compression deformation.

In some embodiments, the functional part include a water-cooled disk 233, a thermocouple 234, a central air tube base 236, etc. The water-cooled disk 233 contacts the bottom of the first recess 225 through the abutting spring, which is in a compression state to push the water-cooled disk 233 upward. Since the chuck body 220 of the embodiments is not welded with the base support of the AlSiC ceramic material, the water-cooled disk 233 direct contacts the bottom surface of the chuck body recess 225. Since the ceramic material of the chuck 22 has good compactness, it ensures that there is no small gap between the chuck 22 and the water-cooled disc body 233, which improves uniformity of heat transfer. At the same time, it is not necessary to use a component such as a graphite thermal conductive film to enhance heat transfer capacity, which simplifies the structure of the electrostatic chuck, and saves cost.

In some embodiments, a groove is formed at a surface (i.e., upper surface) of the water-cooled disk 233 facing the first recess 225. The central air tube base 236 is placed at the groove and contacts the bottom surface of the first recess 225. The central air tube base 236 and the bottom surface of the first recess 225 are sealed by a second seal ring 235, so that a vacuum is formed between the first recess 225, the second seal ring 235, and the central air tube base 236, and the area surrounded by the first recess 225, the second seal ring 235, the center air tube base 236, the second recess 2313, an inner side of the annular protrusion 2312, and the first seal ring 232 is in an atmospheric state.

In some embodiments, the thermocouple 234 is placed at the groove. A second support is placed at the groove to support the thermocouple 234 and cause the thermocouple 234 to contact the bottom surface of the first recess 225. That is, the thermocouple 234 can directly measure temperature of the chuck 22. Since the ceramic material of the chuck 22 has a good compactness, the uniformity of the heat transfer and accuracy of temperature measurement are improved. Since the chuck body of the embodiments is not welded with the base support, the thermocouple 234 can directly contact the chuck 22, therefore, it is not necessary to punch holes at the base support. As such, the manufacturing process of the electrostatic chuck is simplified.

Optionally, the second support may be an elastic component such as an abutting spring.

In some embodiments, a center hole is placed at the base body 2311, passing through along a thickness direction of the base body 2311 at the second recess 2313. The support includes a bellows 239, which is placed at the bottom of the base body 2311, is connected to the center hole, and accommodates various pipelines connected to the functional part.

Figure 6:
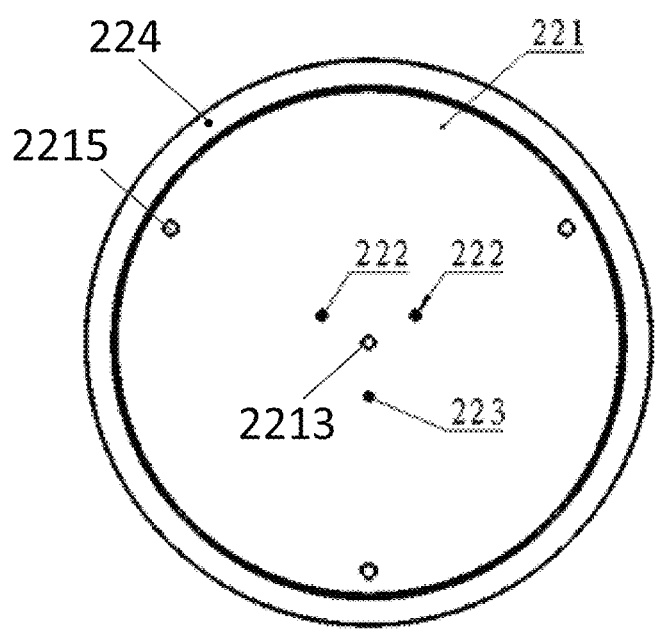
FIG. 6 is a bottom view of a main body of the electrostatic chuck according to embodiments of the disclosure.

For example, the central air tube 238 of the pipeline 2314 is connected to the central air hole 2213 (as shown in FIG. 6) through the central air tube base 236, is connected to air paths in the chuck 22, and is configured for cooling gas. In addition, the water pipe of the pipeline 2314 is connected to the water-cooled disk 233 to provide cooling water. Conductive wire of the pipeline 2314 is electrically connected to the thermocouple 234 and is configured to transmit signals of the thermocouple 234.

Figure 7:
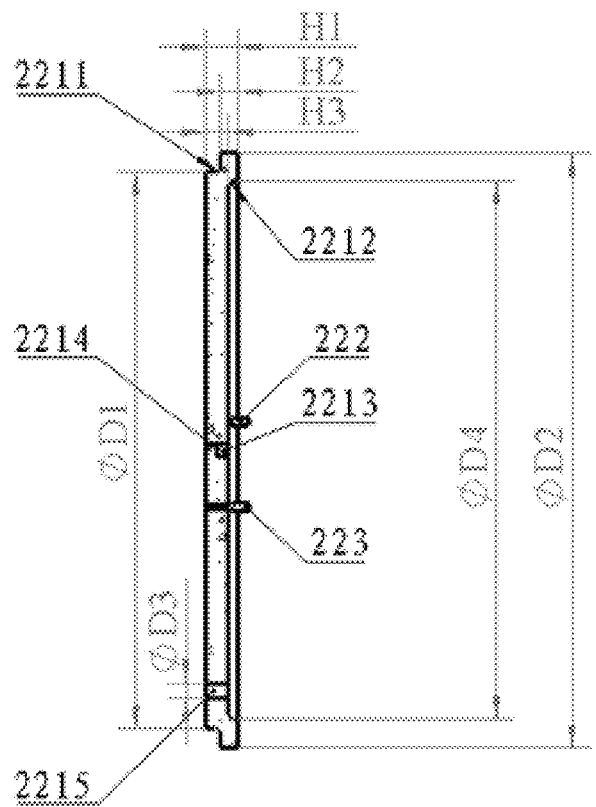
FIG. 7 is a dimensional view of the main body of the electrostatic chuck according to embodiments of the present disclosure.

With reference to FIG. 6 and FIG. 7, the chuck body of the embodiments is further described. The central air hole 2213 is placed at a center position of the chuck body 220 and forms air paths through the chuck 22 with three uniformly distributed branch air holes 2214 connected to the central air hole 2213. The cooling gas of the central air tube 238 flows out from the upper surface of the chuck body 220 through the central air hole 2213 and each of the branch air holes 2214, and cools the to-be-processed workpiece during the process.

The chuck body 220 further includes two electrode terminals 222 and a potential measurement terminal 223. The electrode terminals 222 are inserted into but does not penetrate the chuck body 220 from one side of the recess 225. Electrodes are placed at the chuck body 220 and is electrically connected to the electrode terminal 222. The electrode leads of the support assembly pipeline 2314 are electrically connected to the electrode terminals 222. The electrode leads are further connected to a power source to transmit power to the electrodes. The electrode terminals 222 are direct current (DC) electrode terminals, and the electrodes are DC electrodes. DC power source supplies the power to the DC electrodes through the electrode leads to generate electrostatic forces. The electrode terminals 222 may also be direct current/radio frequency (CD/RF) electrode terminals. The electrode may be a DC electrode and a RF electrode. A DC power source and a RF power source may supply power to the DC electrode and the RF electrode through the electrode leads, respectively. The potential measurement terminal 223 is inserted through the chuck body 220 from a side of the first recess 225 to measure potential of the to-be-processed workpiece. The electrode terminals 220 and the potential measurement terminal 223 are embedded in chuck 22 when chuck 22 is sintered, and are integrally formed with chuck 22 by sintering.

The chuck body 220 further includes three thimble holes 2215 evenly distributed along the circumference, which are configured for thimbles of a thimble system to pass through and to lift or lower the to-be-processed workpiece.

With further reference to FIG. 7, a radius of the first rounded corner is R1~R3 mm, and a radius of the second rounded corner is R1~R3 mm. The first recess 225, the protrusion 221, and the second recess form a concentric circle structure, where a diameter D1 of the protrusion 221 is Φ292~Φ298 mm, a diameter D2 of the chuck body 220 is Φ308~Φ330 mm, and a diameter D3 of the thimble hole 2215 is R3~R5 mm. A diameter D4 of the first recess 225 is D1−(8~12 mm). A distance H1 between the surface (i.e., upper surface) of the protrusion facing away from the base 231 and the second surface (i.e., bottom surface) of the chuck body 220 facing the base 231 is 18~24 mm. A distance H2 (i.e., upper surface) of the chuck body 220 facing away from the base 231 and the above-mentioned second surface is 10~15 mm. A depth H3 of the first recess 225 is 13~15 mm.

In the chuck body 220 configured with the above-mentioned dimension, an absolute difference between the diameter of the first recess 225 and the diameter of the protrusion 221 is 8~12 mm. Accordingly, the structurally weak part of the chuck 22 has a sufficient width and a sufficient area for the shear surface, which ensures that the chuck 22 has the sufficient structural strength and has the ability to withstand the shear forces when the chuck 22 is directly fixed to the support assembly 23. A width of the protrusion 221 does not exceed 11 mm. A distance from any point of the chuck body 220 to any surface of the chuck body 220 does not exceed 12 mm. This ensures complete sintering during the process, a uniform size of the ceramic particles, and good mechanical performance.

It can be seen that the electrostatic chuck of these embodiments does not need to weld ceramic of other materials to the chuck body. The shape and dimension of the chuck body can withstand the shearing forces and have good processability. The ceramic chuck body with uniform particles can be obtained by sintering, which simplifies the manufacturing process and reduces processing cost. The chuck body uses a single ceramic material and has stable electrical performance. The chuck body does not cause variabilities of the electrical performance due to differences of the welding processes with different batch of AlN and AlSiC materials, which is beneficial to control the electric field of the RF environment in the reaction chamber. The chuck body does not have a hole-structure at all, which can effectively reduce micro-cracks generated by the process, effectively prevent the ceramic micro-cracks from spreading, and increase the fracture strength of the chuck body.

Figure 8:
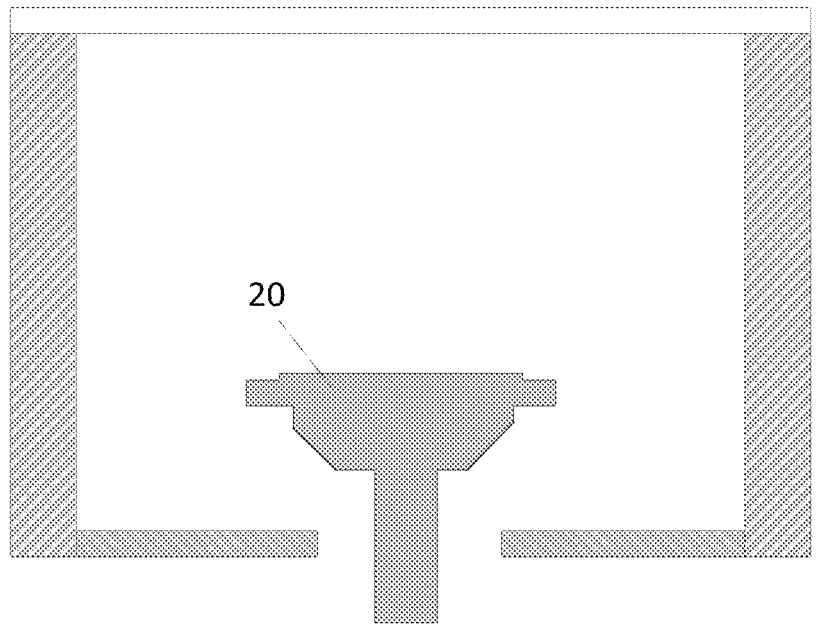
FIG. 8 is a schematic diagram of a plasma device according to embodiments of the present disclosure.

Another embodiment of the present disclosure provides semiconductor equipment, with reference to FIG. 8, which includes a reaction chamber. An electrostatic chuck 20 is placed in the reaction chamber, the electrostatic chuck 20 uses the designs of the electrostatic chuck described in the embodiments of the present disclosure.

The specific embodiments described above further describe the purpose, the technical solution, and the beneficial effects of the present disclosure in detail. It should be noted that the embodiments described above are merely specific embodiments of the present disclosure and are not used to limit the present disclosure. Any modification, equivalent replacement, advancement, etc., made within the spirit and principles of the present disclosure are within the scope of the present disclosure.

It should also be noted that directional terms mentioned In some embodiments, such as "up," "down," "front," "back," "left," "right," etc., are only directions of the drawings, and are not used to limit the scope of the present disclosure. Throughout the drawings, same elements are represented by same or similar reference numerals. When confusion may be caused in understanding of the present disclosure, conventional structures or constructions are omitted.

Unless otherwise known, numerical parameters in the present specification and the appended claims are approximate values and can be changed according to the required characteristics obtained from content of the present disclosure. Specifically, all numbers used in the specification and claims to indicate the content of the composition, reaction conditions, etc. should be understood to be described in all cases by the term "about." In general, the meaning of its expression is that it includes a specific number with ±10% change in some embodiments, ±5% change in some embodiments, ±1% change in some embodiments, and ±0.5% change in some embodiments.

Furthermore, the word "include" does not exclude the presence of elements or steps not listed in the claims. The word "a" or "an" preceding an element does not exclude the presence of a plurality of such elements.

Ordinal numbers such as "first," "second," "third," and the like used in the specification and the claims are used to describe the corresponding elements but do not imply and represent that the elements have any ordinal, an order of an element and another element, or an order of manufacturing methods. The use of these ordinal numbers is only used to clearly distinguish one element with a certain name from another element with the same name.

Similarly, it should be understood that in order to simplify the present disclosure and help understand one or more of various disclosed aspects, in the above description of the exemplary embodiments of the present disclosure, various features of the present disclosure are sometimes grouped together into a single embodiment, figure, or description. However, the disclosed method should not be construed to reflect a following intention, that is, the claimed claims of the present disclosure have more features than the features expressly described in each claim. More specifically, as reflected in the following claims, the disclosed aspect is less than all features of the single embodiments disclosed previously. Therefore, the claims following specific embodiments are hereby expressly incorporated into the specific embodiments, where each claim is used as a separate embodiment of the present disclosure.

What is claimed is:

1. An electrostatic chuck, comprising:
a support assembly, including a base, wherein the base includes a base body;
a chuck, placed at the base of the support assembly and including a chuck body, wherein
a first surface of the chuck body includes a protrusion facing away from the base and configured to carry a workpiece, a second surface of the chuck body includes a first recess, and the first recess is formed by a bottom surface and two sides of the chunk body; and
a fastening assembly, configured to removably fix the chuck at the base of the support assembly, wherein when being fixed by the fastening assembly,
a top surface of the base body includes an annular protrusion, protruding to contact the bottom surface of the chunk body in the first recess and dividing the first recess into portions including a central portion and an annular side portion surrounding the central portion, and
an edge of the first recess of the chuck body physically contacts the top surface of the base body to enclose the annular side portion with the annular protrusion.

2. The electrostatic chuck of claim 1, wherein the fastening assembly includes:
a pressure ring, including a pressure ring body placed at the base and surrounding the chuck, the pressure ring body and the base being connected by a plurality of screws; and
a pressing part being placed at the pressure ring body and pressing an edge part of the chuck.

3. The electrostatic chuck of claim 2, wherein:
the protrusion is formed at a center area of the first surface of the chuck body; and
the pressing part of the fastening assembly is stacked at an edge area of the first surface of the protrusion of the chuck.

4. The electrostatic chuck of claim 3, wherein a surface of the pressing part of the fastening assembly facing away from the base is lower than a surface of the protrusion of the chuck for carrying the workpiece.

5. The electrostatic body of claim 2, wherein material used by the pressure ring of the fastening assembly includes a ceramic or metal material.

6. The electrostatic body of claim 1, wherein:
the support assembly further includes a functional part; and
the first recess and the base of the support assembly form a space to accommodate the functional part and pipelines connected to the functional part.

7. The electrostatic body of claim 1, wherein:
a distance between a surface of the protrusion facing away from the base and the second surface of the chuck body facing the base is 18~25 mm;
a distance between the first surface of the protrusion of the chuck and the second surface of the chuck body facing the base is 10~15 mm; and
a depth of the first recess is 13~15 mm.

8. The electrostatic body of claim 1, wherein:
a first seal ring is placed between the annular protrusion of the base body and the bottom surface of the chuck body of the first recess; and
a second recess is formed at the top surface of the base body and at an inner side of the annular protrusion of the base body and configured to form the space at least with the central portion of the first recess to accommodate the functional part and the pipelines connected to the functional part; and
a first support, placed at the second recess, configured to support the functional part, and causing the functional part to contact the bottom surface of the chuck body of the first recess.

9. The electrostatic chuck of claim 8, wherein the first support includes an abutting spring.

10. The electrostatic chuck of claim 9, wherein the functional part includes a water-cooled disk contacting the bottom surface of the chuck body of the first recess through the abutting spring.

11. The electrostatic chuck of claim 10, wherein:
a groove is formed at a surface of the water-cooled disk facing the first recess; and
the functional part further includes:
a central air tube base configured at the groove, the central air tube base contacting the bottom surface of the chuck body of the first recess, and
a second seal ring placed between the central air tube base and the bottom surface of the chuck body of the first recess.

12. The electrostatic chuck of claim 11, wherein the functional part further includes:
a thermocouple, placed at the groove; and
a second support, placed at the groove, configured to support the thermocouple, and causing the thermocouple to contact the bottom surface of the chuck body of the first recess.

13. The electrostatic chuck of claim 8, wherein:
in the base body, a center hole penetrating at a thickness direction of the base body is placed at the second recess; and the support assembly further includes a bellows placed at a bottom of the base body, connected to the center hole, and configured to accommodate the pipelines.

14. The electrostatic chuck of claim 1, wherein the protrusion of the chuck and the first recess are placed concentrically, and a diameter of the first recess is smaller than a diameter of the protrusion.

15. The electrostatic chuck of claim 14, wherein an absolute difference between the diameter of the first recess and the diameter of the protrusion is 8~12 mm.

16. The electrostatic chuck of claim 1, wherein the chuck is made of an integrally formed ceramic material.

17. The electrostatic chuck of claim 16, wherein the ceramic material includes aluminum nitride (AlN) ceramic, or aluminum oxide ($Al_2O_3$) ceramic.

18. The electrostatic chuck of claim 16, wherein electrode terminals and a potential measurement terminal are placed at the chuck and are integrally formed by sintering with the chuck.

19. A piece of semiconductor equipment, comprising a reaction chamber, wherein:
   an electrostatic chuck is placed in the reaction chamber; and
   the electrostatic chuck includes:
      a support assembly, including a base, wherein the base includes a base body;
      a chuck, placed at the base of the support assembly and including a chuck body, wherein
         a first surface of the chuck body includes a protrusion facing away from the base and configured to support a workpiece, a second surface of the chuck body includes a first recess, and the first recess is formed by a bottom surface and two sides of the chunk body; and
      a fastening assembly, configured to removably fix the chuck at the base of the support assembly, wherein when being fixed by the fastening assembly,
         a top surface of the base body includes an annular protrusion, protruding to contact the bottom surface of the chunk body in the first recess and dividing the first recess into portions including a central portion and an annular side portion surrounding the central portion, and
         an edge of the first recess of the chuck body physically contacts the top surface of the base body to enclose the annular side portion with the annular protrusion.

20. The semiconductor equipment of claim 19, wherein the fastening assembly includes:
   a pressure ring, including a pressure ring body placed at the base of the support assembly and surrounding the chuck, the pressure ring body of the fastening assembly and the base of the support assembly being connected by a plurality of screws; and
   a pressing part being placed at the pressure ring body of the fastening assembly and pressing an edge part of the chuck.

* * * * *